(12) United States Patent
Wang et al.

(10) Patent No.: US 11,335,729 B2
(45) Date of Patent: May 17, 2022

(54) SEMICONDUCTOR MEMORY DEVICE

(71) Applicant: UNITED MICROELECTRONICS CORP., Hsin-Chu (TW)

(72) Inventors: Hui-Lin Wang, Taipei (TW); Chia-Chang Hsu, Kaohsiung (TW); Chen-Yi Weng, New Taipei (TW); Hung-Chan Lin, Tainan (TW); Jing-Yin Jhang, Tainan (TW); Yu-Ping Wang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 46 days.

(21) Appl. No.: 17/074,643

(22) Filed: Oct. 20, 2020

(65) Prior Publication Data
US 2021/0036053 A1 Feb. 4, 2021

Related U.S. Application Data

(62) Division of application No. 16/214,127, filed on Dec. 9, 2018, now Pat. No. 10,847,574.

(30) Foreign Application Priority Data

Nov. 30, 2018 (CN) .................. 201811451705.X

(51) Int. Cl.
*G11C 11/16* (2006.01)
*H01L 27/22* (2006.01)
*H01L 23/48* (2006.01)
*H01L 43/12* (2006.01)
*H01L 23/544* (2006.01)
*H01L 21/321* (2006.01)
(Continued)

(52) U.S. Cl.
CPC ............ *H01L 27/222* (2013.01); *G11C 11/16* (2013.01); *H01L 21/3212* (2013.01); *H01L 21/762* (2013.01); *H01L 23/481* (2013.01); *H01L 23/485* (2013.01); *H01L 23/544* (2013.01); *H01L 43/12* (2013.01)

(58) Field of Classification Search
CPC . H01L 27/222; H01L 21/3212; H01L 21/762; H01L 23/481; H01L 23/485; H01L 23/544; H01L 43/12; G11C 11/16
See application file for complete search history.

(56) References Cited

U.S. PATENT DOCUMENTS 6,858,441 B2 2/2005 Nuetzel
7,241,668 B2 7/2007 Gaidis
(Continued)

*Primary Examiner* — Tuan T Nguyen
(74) *Attorney, Agent, or Firm* — Winston Hsu

(57) ABSTRACT

The disclosure provides a semiconductor memory device including a substrate having a memory cell region and an alignment mark region; a dielectric layer covering the memory cell region and the alignment mark region; conductive vias in the dielectric layer within the memory cell region; an alignment mark trench in the dielectric layer within the alignment mark region; and storage structures disposed on the conductive vias, respectively. Each of the storage structures includes a bottom electrode defined from a bottom electrode metal layer, a magnetic tunnel junction (MTJ) structure defined from an MTJ layer, and a top electrode. A residual metal stack is left in the alignment mark trench. The residual metal stack includes a portion of the bottom electrode metal layer and a portion of the MTJ layer.

6 Claims, 4 Drawing Sheets

(51) Int. Cl.
*H01L 21/762* (2006.01)
*H01L 23/485* (2006.01)

(56) References Cited

U.S. PATENT DOCUMENTS 10,199,572 B2 * 2/2019 Yi .......................... H01L 43/12
2016/0268336 A1 * 9/2016 Shum ..................... H01L 43/12

* cited by examiner

SEMICONDUCTOR MEMORY DEVICE

CROSS REFERENCE TO RELATED APPLICATIONS

This application is a division of U.S. application Ser. No. 16/214,127 filed on Dec. 9, 2018, which is included in its entirety herein by reference.

BACKGROUND OF THE INVENTION

1. Field of the Invention

The present invention relates to the field of semiconductor technology, and more particularly to a semiconductor memory device and a method of fabricating the same.

2. Description of the Prior Art

As known in the art, spin-transfer torque magneto-resistance random access memory (STT-MRAM) is a non-volatile memory that has come under much scrutiny recently in the industry, which has several advantages over the conventional magneto-resistance random access memory (MRAM). For example, these advantages include higher endurance, lower-power consumption, and faster operating speed.

Typically, an alignment mark (AM) is formed before the deposition of the magnetic tunnel junction (MTJ) layer and the top electrode metal layer of the STT-MRAM to facilitate the alignment for the subsequent MTJ layer etching process. Usually, the bottom electrode of the STT-MRAM includes tantalum (Ta) or tantalum nitride (TaN). However, the tantalum oxide by-products are difficult to remove by general chlorine-based or fluorine-based etchant gas. These by-products cause serious defects in mass production.

SUMMARY OF THE INVENTION

The present invention provides an improved semiconductor memory device and a method of fabricating the same that can address the deficiencies and shortcomings of the prior art described above.

One aspect of the present disclosure provides a semiconductor memory device including a substrate having a memory cell region and an alignment mark region; a dielectric layer covering the memory cell region and the alignment mark region; conductive vias in the dielectric layer within the memory cell region; an alignment mark trench in the dielectric layer within the alignment mark region; and storage structures disposed on the conductive vias, respectively. Each of the storage structures includes a bottom electrode defined from a bottom electrode metal layer, a magnetic tunnel junction (MTJ) structure defined from an MTJ layer, and a top electrode. A residual metal stack is left in the alignment mark trench. The residual metal stack includes a portion of the bottom electrode metal layer and a portion of the MTJ layer.

Another aspect of the present disclosure provides a method for forming a semiconductor memory device. A substrate having thereon a memory cell region and an alignment mark region is provided. A dielectric layer is formed on the substrate. The dielectric layer covers the memory cell region and the alignment mark region. A plurality of conductive vias is formed in the dielectric layer within the memory cell region. An alignment mark trench is formed in the dielectric layer within the alignment mark region. A bottom electrode metal layer is formed on the memory cell region and the alignment mark region. The bottom electrode metal layer conformally covers a sidewall and a bottom surface of the alignment mark trench. The bottom electrode metal layer is then polished.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention. Therefore, the following detailed description is not to be considered as limiting, but the embodiments included herein are defined by the scope of the accompanying claims.

Figure 1:
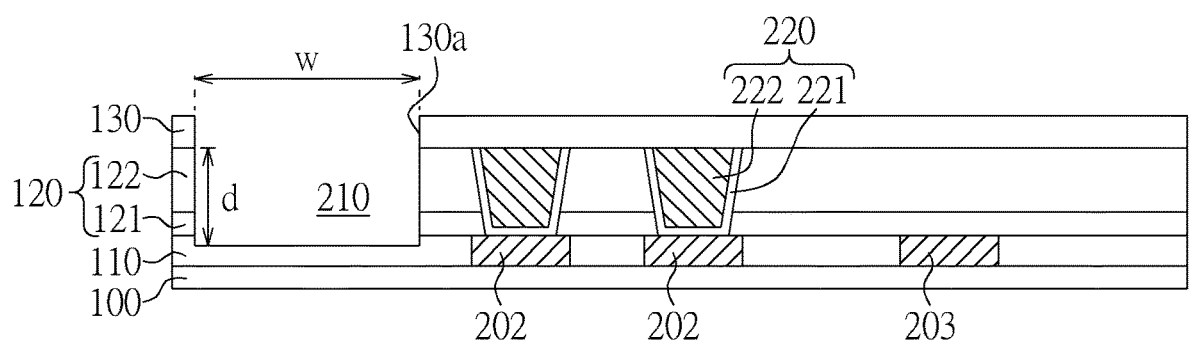
FIG. 1 to FIG. 8 are schematic cross-sectional diagrams showing a method of fabricating a semiconductor memory device according to an embodiment of the invention.

FIG. 1 to FIG. 8 are schematic cross-sectional diagrams showing a method of fabricating a semiconductor memory device according to an embodiment of the invention. As shown in FIG. 1, first, a substrate 100, for example, a semiconductor substrate having an alignment mark region 101, a memory cell region 102, and a logic circuit region 103 is provided. In accordance with an embodiment of the invention, the substrate 100 may comprise an inter-layer dielectric (ILD) layer 110, such as an ultra-low k (ultra-low dielectric constant) material layer.

According to an embodiment of the invention, multiple conductor structures 202 are formed in the interlayer dielectric layer 110 in the memory cell region 102. For example, the conductor structures 202 may include a copper layer, a barrier layer, or the like, but is not limited thereto. The conductor structures 202 may be formed using copper damascene processes, but is not limited thereto. According to an embodiment of the invention, at least one conductor structure 203 is formed in the interlayer dielectric layer 110 in the logic circuit region 103. For example, the conductor structure 203 may include copper or the like, but is not limited thereto.

Subsequently, a dielectric layer 120 is deposited on the substrate 100. The dielectric layer 120 is deposited on the interlayer dielectric layer 110, and the dielectric layer 120 covers the alignment mark region 101, the memory cell region 102, and the logic circuit region 103. According to an embodiment of the invention, the dielectric layer 120 may include an etch stop layer 121 such as a nitrogen-doped silicon carbide (SiCN) layer, and a silicon oxide layer 122 such as a tetraethylorthosilicate (TEOS) silicon oxide layer. Those skilled in the art will appreciate that the above dielectric layer materials are merely illustrative and the disclosure is not limited to the above listed materials.

Next, multiple conductive vias 220 are formed in the dielectric layer 120 in the memory cell region 102. According to an embodiment of the invention, the conductive via 220 may include a liner layer 221 and a conductive layer 222. For example, the liner layer 221 can comprise titanium (Ti), titanium nitride (TiN), or a combination thereof. For example, the conductive layer 222 may comprise tungsten, but is not limited thereto. Those skilled in the art will appreciate that the above conductor materials are merely illustrative and the disclosure is not limited to the above listed materials. The formation of the conductive vias 220 in the dielectric layer 120 in the memory cell region 102 is well known in the art, which may include lithography, etching, metal deposition, polishing, and the like, the details of which are not described herein.

After completing the conductive vias 220, a photoresist pattern 130 is formed on the dielectric layer 120. The photoresist pattern 130 covers the upper surfaces of the conductive vias 220. According to an embodiment of the invention, the photoresist pattern 130 includes an opening 130a located in the alignment mark region 101 to expose a portion of the upper surface of the dielectric layer 120. According to an embodiment of the invention, the width w of the opening 130a may be between about 1 micrometer and about 4 micrometers.

Next, an anisotropic dry etching process is performed, the dielectric layer 120 is etched through the opening 130a of the photoresist pattern 130, and an alignment mark trench 210 having a width approximately equal to the width w of the opening 130a is formed in the dielectric layer 120. According to an embodiment of the invention, the alignment mark trench 210 may penetrate the dielectric layer 120 and extend into the underlying interlayer dielectric layer 110 to a predetermined depth. In accordance with an embodiment of the invention, for example, the alignment mark trench 210 may have a trench depth d between about 400 angstroms and about 2000 angstroms.

Figure 2:
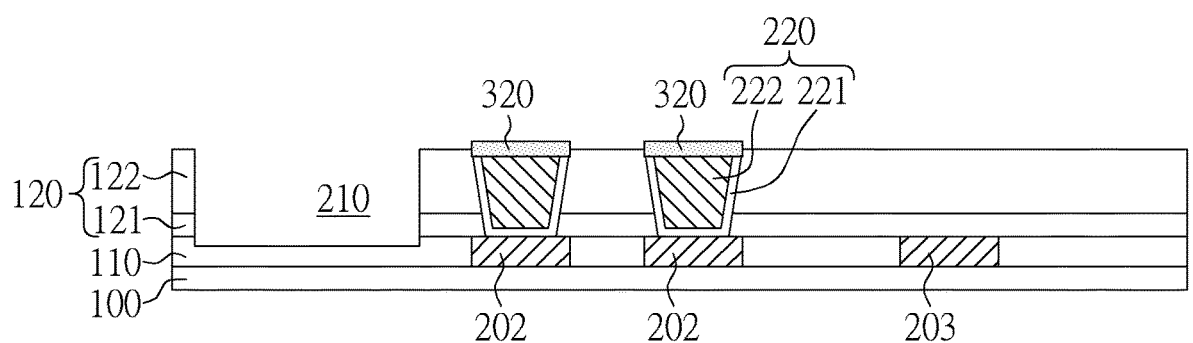

As shown in FIG. 2, after the alignment mark trench 210 is formed, the photoresist pattern 130 is removed. In accordance with an embodiment of the invention, the removal of the photoresist pattern 130 is well known in the art, for example, the photoresist pattern 130 can be removed using an oxygen plasma ashing process. When the photoresist pattern 130 is removed by the oxygen plasma ashing process, a metal oxide layer 320 may be formed on each of the conductive vias 220. According to an embodiment of the invention, the metal oxide layer 320 is formed because the conductive layer 222 is in contact with the oxygen plasma.

Figure 3:
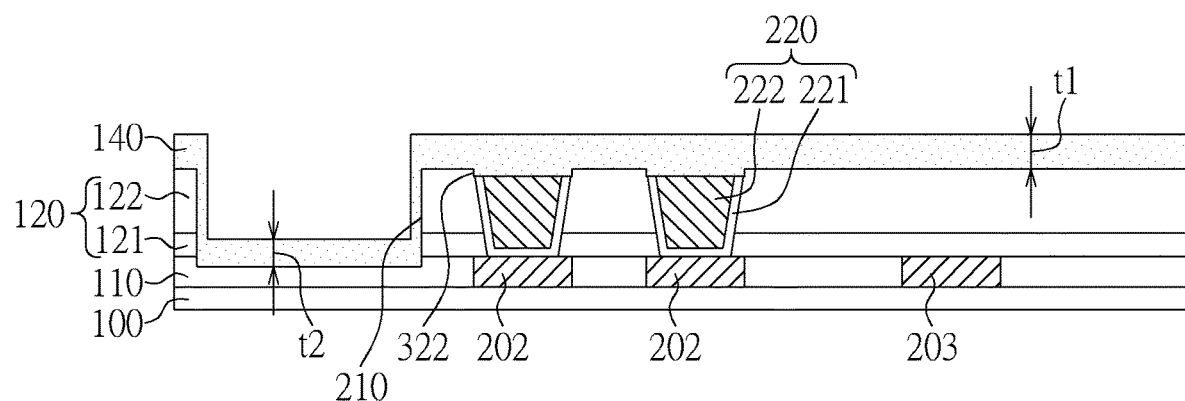

As shown in FIG. 3, a pre-cleaning process, such as an argon bombardment process, or a hydrogen-based reduction process, may be performed to remove the metal oxide layer 320 from the surface of each of the conductive vias 220. According to an embodiment of the invention, after the metal oxide layer 320 is removed, a recess 322 is formed on each of the conductive vias 220.

As shown in FIG. 3, a bottom electrode metal layer 140 is then deposited on the substrate 100 in a blanket manner such that the bottom electrode metal layer 140 covers the alignment mark region 101, the memory cell region 102, and the logic circuit region 103. According to an embodiment of the invention, the bottom electrode metal layer 140 fills the recess 322 on each of the conductive vias 220, and the bottom electrode metal layer 140 directly contacts the conductive vias 220. In accordance with an embodiment of the invention, the bottom electrode metal layer 140 conformally covers a sidewall and a bottom surface of the alignment mark trench 210, and the alignment mark trench 210 is not filled up with the bottom electrode metal layer 140. According to an embodiment of the invention, the thickness $t_1$ of the bottom electrode metal layer 140 directly above the dielectric layer 120 is between about 50 angstroms and about 150 angstroms, and the thickness $t_2$ at the bottom of the alignment mark trench 210 is approximately equal to the thickness $t_1$. According to an embodiment of the present invention, the bottom electrode metal layer 140 may comprise titanium (Ti), titanium nitride (TiN), tantalum (Ta), tantalum nitride (TaN), or a combination thereof, but is not limited thereto.

Figure 4:
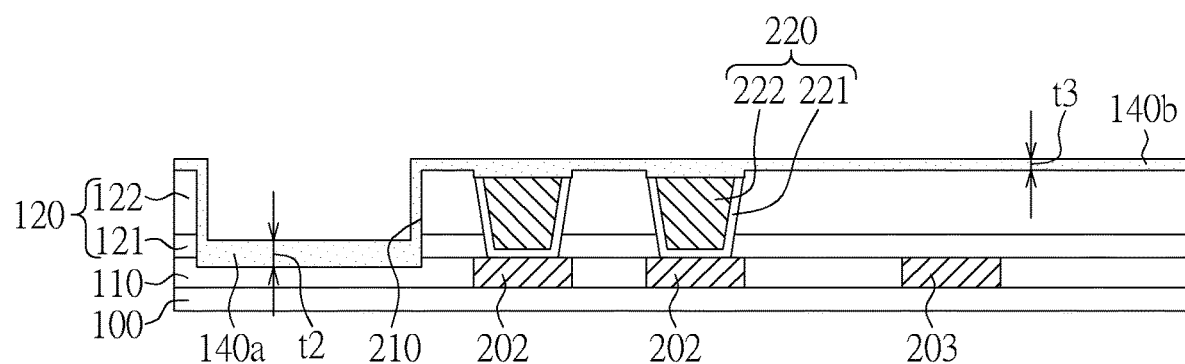

As shown in FIG. 4, a chemical mechanical polishing (CMP) process may be performed to polish the bottom electrode metal layer 140 to remove an upper portion of the bottom electrode metal layer 140 in the memory cell region 102 and logic circuit region 103. A top surface of the bottom electrode metal layer 140 with high-degree of planarity is formed in the memory cell region 102 and the logic circuit region 103. According to an embodiment of the invention, after polishing the bottom electrode metal layer 140, the thickness $t_3$ of the remaining portion 140b of the bottom electrode metal layer in the memory cell region 102 and the logic circuit region 103 may be between about 30 angstroms and about 150 angstroms.

According to an embodiment of the present invention, after the CMP process is completed, the thickness $t_2$ of the remaining portion 140a of the bottom electrode metal layer at the bottom of the alignment mark trench 210 is greater than the thickness $t_3$ of the remaining portion 140b of the bottom electrode metal layer in the memory cell region 102 and the logic circuit region 103.

Figure 5:
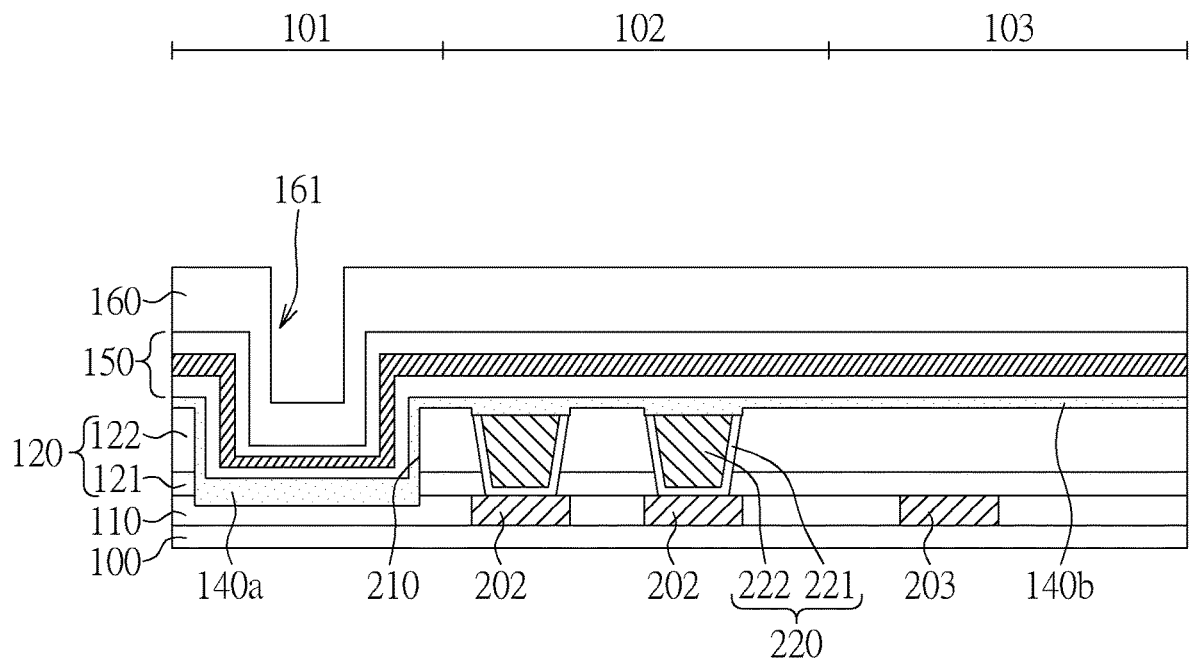

As shown in FIG. 5, a magnetic tunnel junction (MTJ) layer 150 is then deposited over the bottom electrode metal layer 140. The MTJ layer 150 may comprise a multilayer structure including, for example, but not limited to, a magnetic reference layer, a magnetic free layer, and a non-magnetic barrier layer. A top electrode metal layer 160 is then deposited on the MTJ layer 150. According to an embodiment of the invention, the top electrode metal layer 160 may comprise titanium, titanium nitride, tantalum, tantalum nitride or a combination thereof. At this point, in the alignment mark region 101, the top surface of the top electrode metal layer 160 may still form a recess structure 161 with respect to the alignment mark trench 210.

Figure 6:
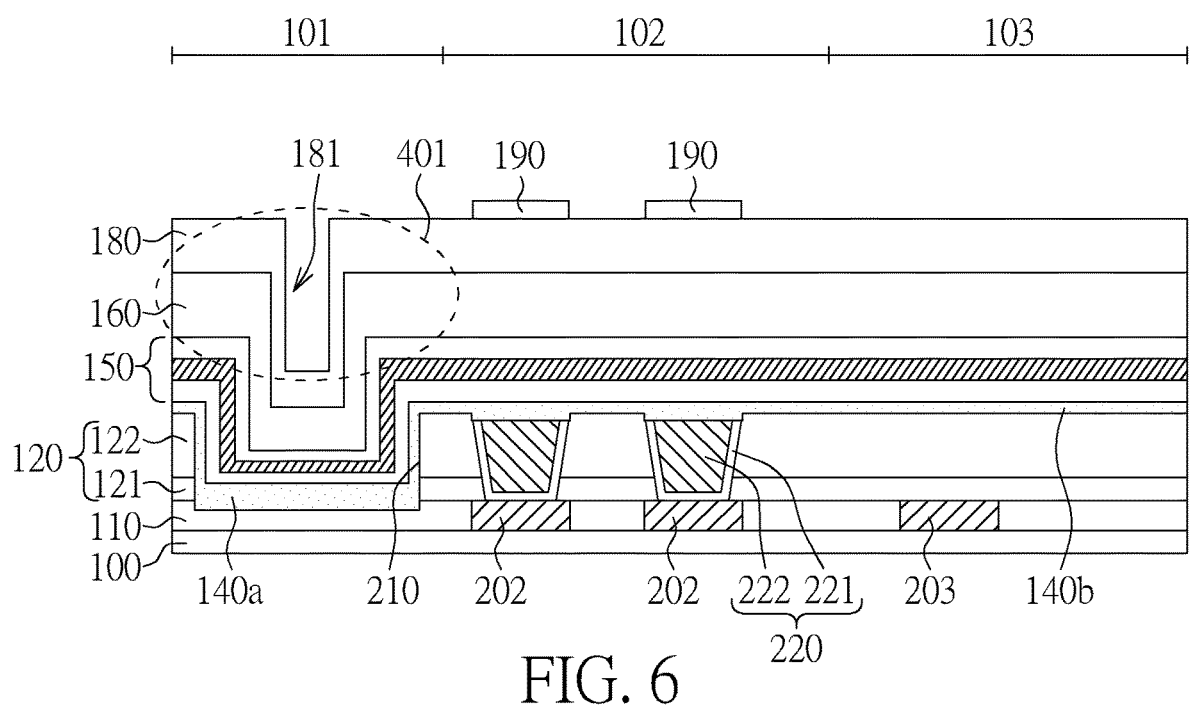

As shown in FIG. 6, a hard mask layer 180, such as silicon nitride or silicon oxide, is deposited on the top electrode metal layer 160, but is not limited thereto. The hard mask layer 180 has a recessed top surface 181 directly above the alignment mark trench 210 to form an alignment mark pattern 401. Subsequently, a lithographic process is performed to form a photoresist pattern 190 on the hard mask layer 180. According to an embodiment of the present invention, through the alignment using the alignment mark pattern 401, the photoresist pattern 190 formed in the memory cell region 102 can accurately define the pattern and position of the subsequent storage structure to be formed, thereby improving the production yield.

Figure 7:
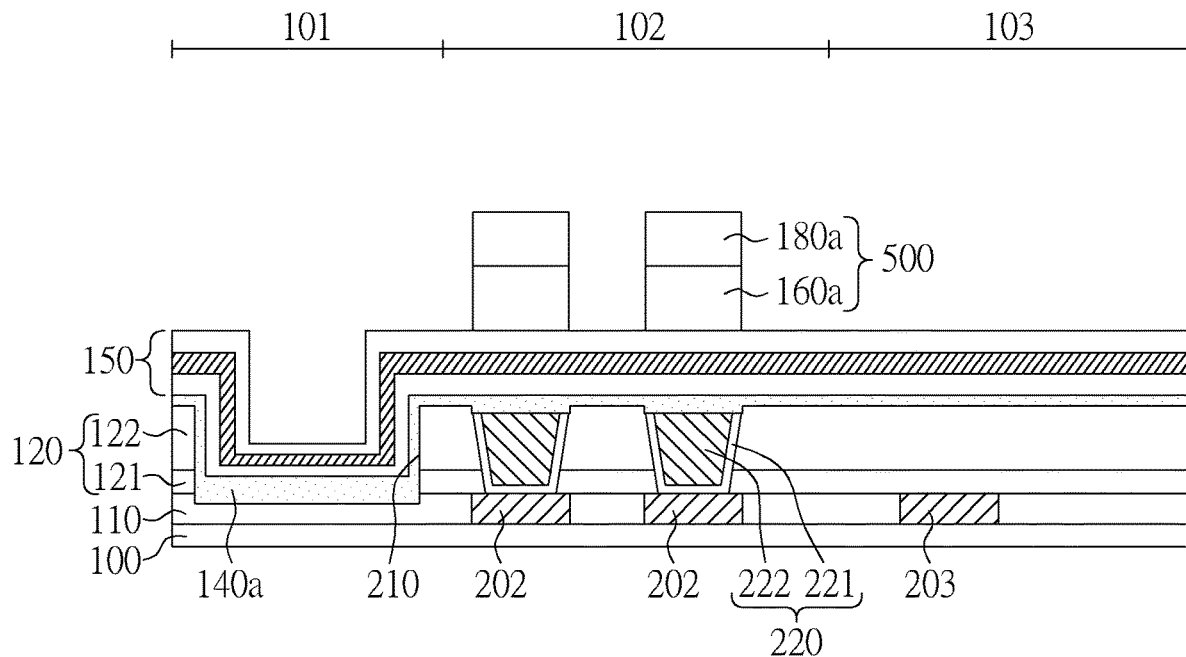

As shown in FIG. 7, a first etching process, for example, a reactive ion etching (RIE) process, is performed to anisotropically etch the hard mask layer 180 and the top electrode metal layer 160 not covered by the photoresist pattern 190. The remaining portion 180a of the hard mask layer 180 and the top electrode 160a are directly under the photoresist pattern 190 constitute the pillar-shaped mask structure 500. According to an embodiment of the invention, at this point, the hard mask layer 180 and the top electrode metal layer 160 directly above the alignment mark trench 210 are completely removed, exposing the MTJ layer 150.

Figure 8:
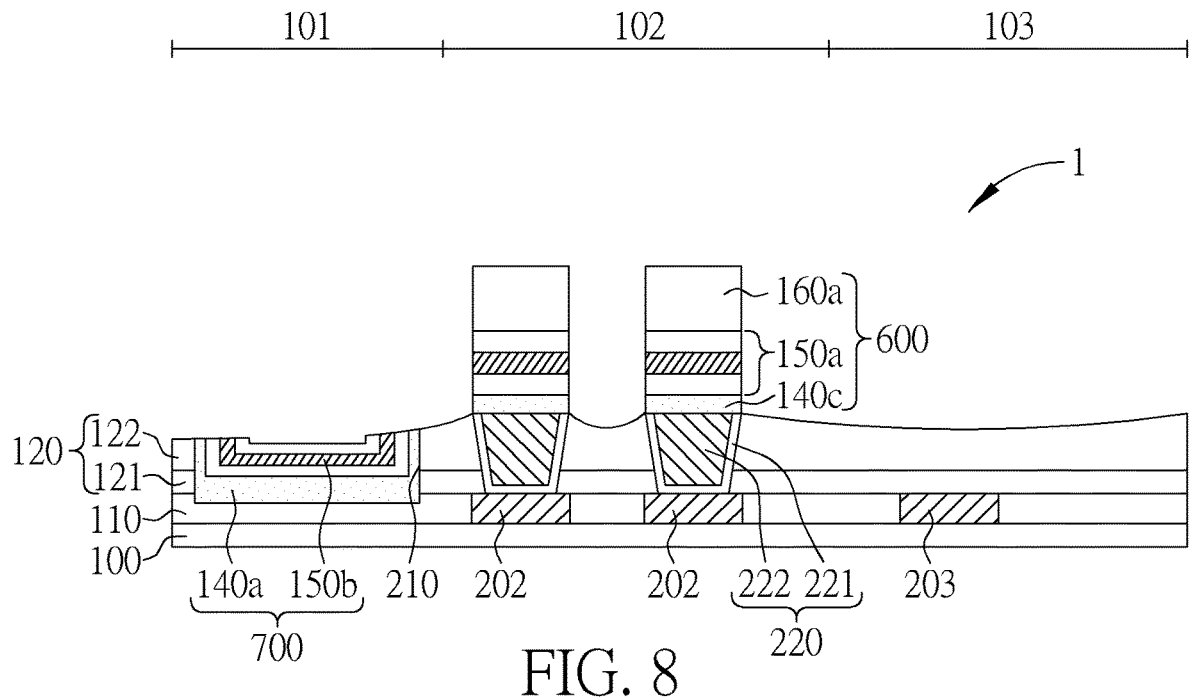

Finally, as shown in FIG. 8, using the pillar-shaped mask structure 500 as an etch resist mask, a second etching process, for example, an Ion Beam Etching (IBE) process is performed to etch the MTJ layer 150, the remaining portion 140b of the bottom electrode metal layer and a portion of the dielectric layer 120, such that the top electrode metal layer 160, the MTJ layer 150 and the remaining portion 140b of the bottom electrode metal layer are patterned into pillar-shaped storage structures 600. The pillar-shaped storage structures 600 are respectively located directly above the conductive vias 220.

Structurally, as shown in FIG. 8, the semiconductor memory device 1 includes a substrate 100 having an alignment mark region 101 and a memory cell region 102 thereon. A dielectric layer 120 is disposed on the substrate 100, and the dielectric layer 120 covers the alignment mark region 101 and the memory cell region 102. Conductive vias 220 are disposed in the dielectric layer 120 in the memory cell region 101. An alignment mark trench 210 is disposed in the dielectric layer 120 in the alignment mark region 101. Storage structures 600 are respectively disposed on the conductive vias 220, wherein each of the storage structures 600 includes a bottom electrode 140c defined from a bottom electrode metal layer 140, a magnetic tunnel junction structure 150a defined from a magnetic tunnel junction layer 150, and a top electrode 160a defined from a top electrode metal layer 160. A residual metal stack 700 is located in the alignment mark trench 210, wherein the residual metal stack 700 includes a remaining portion 140a of the bottom electrode metal layer 140 and a remaining portion 150b of the magnetic tunneling junction layer 150.

According to an embodiment of the invention, the bottom electrodes 140c directly contact the respective conductive vias 220.

According to an embodiment of the invention, the alignment mark trench 210 is not completely filled up with the residual metal stack 700.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory device, comprising:
   a substrate having thereon a memory cell region and an alignment mark region;
   a dielectric layer on the substrate, the dielectric layer covering the memory cell region and the alignment mark region;
   a plurality of conductive vias in the dielectric layer within the memory cell region;
   an alignment mark trench in the dielectric layer within the alignment mark region;
   a plurality of storage structures disposed on the plurality of conductive vias, respectively, wherein each of the plurality of storage structures comprises a bottom electrode defined from a bottom electrode metal layer, a magnetic tunnel junction (MTJ) structure defined from an MTJ layer, and a top electrode defined from a top electrode metal layer; and
   a residual metal stack in the alignment mark trench, wherein the residual metal stack comprises a portion of the bottom electrode metal layer and a portion of the MTJ layer.

2. The semiconductor memory device according to claim 1, wherein the bottom electrode is in direct contact with each of the plurality of conductive vias.

3. The semiconductor memory device according to claim 1, wherein the alignment mark trench is not completely filled up with the residual metal stack.

4. The semiconductor memory device according to claim 1, wherein the bottom electrode metal layer comprises Ti, TiN, Ta, TaN or a combination thereof.

5. The semiconductor memory device according to claim 1, wherein the alignment mark trench has a trench depth ranging between 400 and 2000 angstroms.

6. The semiconductor memory device according to claim 1, wherein the portion of the bottom electrode metal layer at a bottom of the alignment mark trench is thicker than that of the bottom electrode defined from the bottom electrode metal layer.

* * * * *